United States Patent [19]
Tran

[11] Patent Number: 5,631,606
[45] Date of Patent: May 20, 1997

[54] FULLY DIFFERENTIAL OUTPUT CMOS POWER AMPLIFIER

[75] Inventor: Hieu V. Tran, San Jose, Calif.

[73] Assignee: Information Storage Devices, Inc., San Jose, Calif.

[21] Appl. No.: 509,982

[22] Filed: Aug. 1, 1995

[51] Int. Cl.$^6$ .................................................. H03F 3/45
[52] U.S. Cl. ........................................ 330/253; 330/255
[58] Field of Search .................................. 330/253, 255, 330/258, 261

[56] References Cited

U.S. PATENT DOCUMENTS

| | | | |
|---|---|---|---|
| 4,223,238 | 9/1980 | Parkinson et al. | 307/297 |
| 4,425,550 | 1/1984 | Smith et al. | 330/107 |
| 4,439,692 | 3/1984 | Beekmans et al. | 307/297 |
| 4,524,328 | 6/1985 | Abou et al. | 330/253 |
| 4,571,505 | 2/1986 | Eaton, Jr. | 307/297 |
| 4,581,546 | 4/1986 | Allan | 307/297 |
| 4,628,214 | 12/1986 | Leuschner | 307/296 R |
| 4,631,421 | 12/1986 | Inoue et al. | 307/297 |
| 4,710,647 | 12/1987 | Young | 307/297 |
| 4,736,121 | 4/1988 | Cini et al. | 307/297 R |
| 4,739,191 | 4/1988 | Puar | 307/297 |
| 4,739,281 | 4/1988 | Doyle | 330/255 X |
| 4,797,631 | 1/1989 | Hsu et al. | 330/255 |
| 5,497,122 | 3/1996 | Somayajula | 330/255 X |

*Primary Examiner*—Steven Mottola
*Attorney, Agent, or Firm*—Blakely, Sokoloff, Taylor & Zafman LLP

[57] ABSTRACT

A fully differential output CMOS power amplifier suitable to be used in a non-volatile memory mixed mode chip for voice record and playback to drive a very low impedance load such as an 8 ohm speaker from a low voltage power supply. This fully differential CMOS power amplifier utilizes a voltage multiplying technique for the input stage, a level shift/gain stage, and a common mode feedback network. It also utilizes native n-MOS having a threshold voltage $VT \approx 0v$ for the folded cascode differential input, native n-MOS ($VT \approx 0v$) for the source follower output stage, enhancement n-MOS ($VT \approx 0.7$ v) for the common source output, and a voltage regulator using p-MOS diode connected devices for simulating a resistor divider to regulate the voltage multiplier output. The amplifier also includes a mechanism for crossover distortion reduction at the output driver stage, and a scheme to set the idle current in the output driver n-MOS transistors.

15 Claims, 4 Drawing Sheets

FULLY DIFFERENTIAL OUTPUT CMOS POWER AMPLIFIER

BACKGROUND OF THE INVENTION

1. Field of the Invention

This invention relates to the field of analog CMOS integrated circuit design, and specifically to integrated operational amplifiers driving low impedance loads.

2. Prior Art

A fully differential output operational amplifier is normally superior to a single ended output operational amplifier in terms of power supply noise rejection and noise coupling rejection, since the power supply variation or any noise source couples equally to both output branches at the same time and thus appears as a common mode signal not effecting the differential output of the operational amplifier. This is especially important for a mixed mode chip (integrated circuit having both analog and digital circuits on the same substrate), where the noise is generated from the switching of the digital circuits.

In the prior art, fully differential output CMOS power amplifiers are implemented using typically a two (or sometimes more) stage operational amplifier which are powered from the normal system power supply VCC. The typical two stage operational amplifier consists of a mostly differential voltage amplifying input stage for noise and offset considerations, and a current gain and/or MOS output driver stage for driving a low impedance load. These two stages both get their power from VCC. Such CMOS operational amplifiers are difficult to operate from a low voltage power supply for driving low impedance loads, such as an 8 ohm speaker, since the gate driving ability of the MOS output stage is so limited. The limited gate drive could be made up in substantial part by increasing the size of the output devices, but this could make the MOS driver prohibitively large.

Conventional enhancement mode n-MOS input stages for low voltage operation also suffer from minimum input common mode range, since the input voltage has to be at least larger than the VT (threshold voltage) of the input n-MOS. Also, conventional enhancement mode n-MOS source follower output drivers suffer from a limited swing on the output voltage in the positive direction because of the VT drop from the gate to source.

BRIEF SUMMARY OF THE INVENTION

A fully differential output CMOS power amplifier utilizing a voltage multiplying technique to provide a regulated power supply higher than the system power supply to a folded differential input stage, the bias generator, the common mode feedback circuit, and the gain/level shift stage. This allows the analog gate voltages of the output transistors to go much higher than the normal power supply, resulting in significantly reduced required size of the output transistors. Since the pump is mainly to provide for the gate voltages which require little current, it is small. In a preferred embodiment, this CMOS power amplifier is used in a mixed mode chip which already has a voltage multiplier for the on-chip memory circuit, and therefore can readily use the on-chip pump without adding another pump circuit. This power amplifier also includes a voltage regulator to regulate the multiplied voltage to a fixed level to reduce power supply variation and noise from the oscillator of the voltage multiplier.

The voltage regulator is configured in a negative feedback operational amplifier loop with diode connected p-MOS devices serving as a resistor divider to reduce the current loading to the voltage multiplier. Each diode connected p-MOS has its own well tied to its source so the VGS (gate to source voltage) of each p-MOS is precisely mirrored across the diode chain by the negative feedback action. This gives a precise voltage at the output of the regulator, in the preferred embodiment of the invention, 5 times VREF.

This fully differential output CMOS power amplifier also includes a folded cascode differential input stage utilizing native n-MOS (VT≈0v) to give a near rail to rail input common mode range, a native n-MOS (VT≈0v) source follower on the output stage to give a high swing voltage output, an enhancement mode n-MOS common source output stage, a mechanism for reducing crossover distortion of the output driver stage, and a scheme to set the idle current in the output drivers when the input signal is zero.

DETAILED DESCRIPTION OF THE INVENTION

Figure 1A:
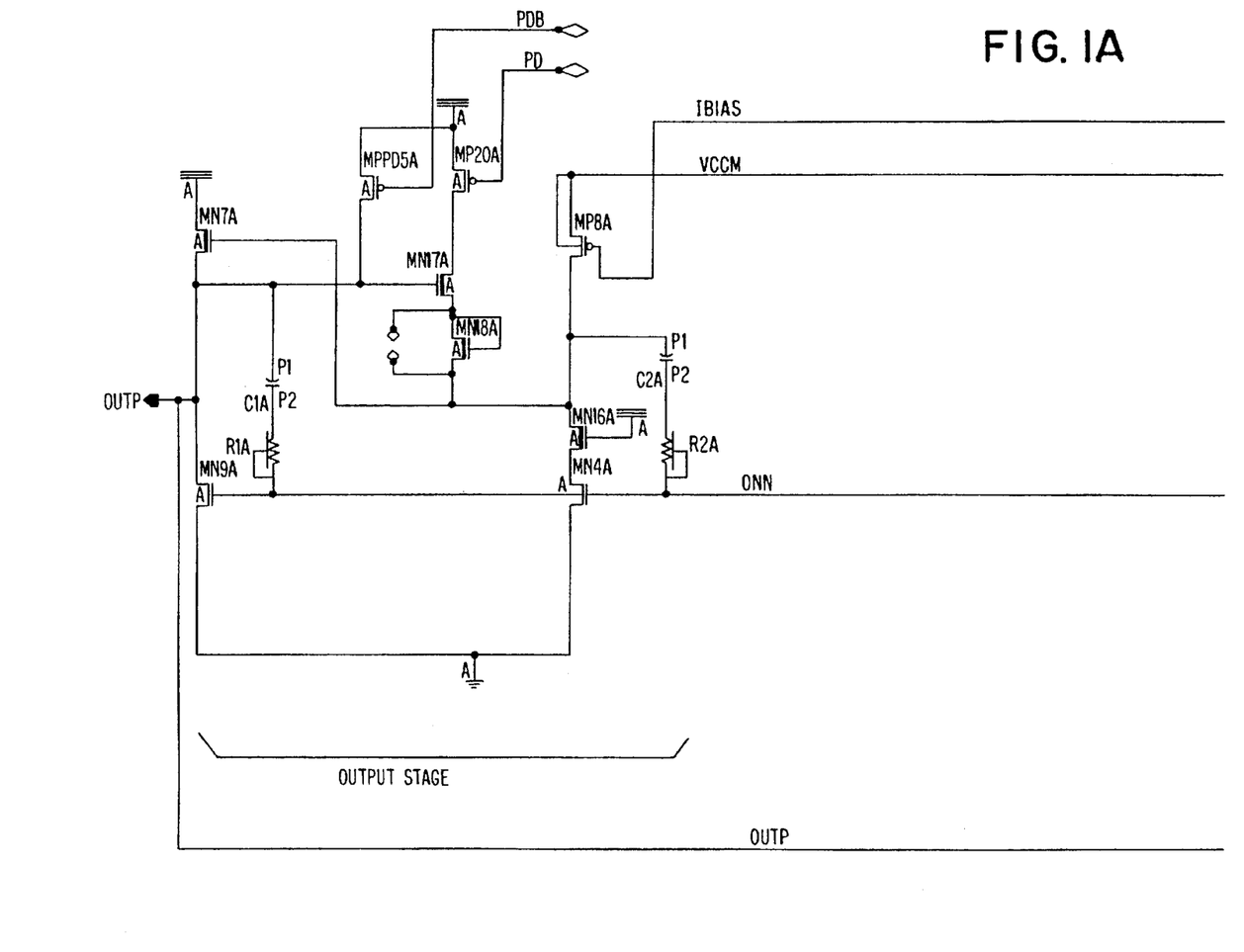
Figure 1B:
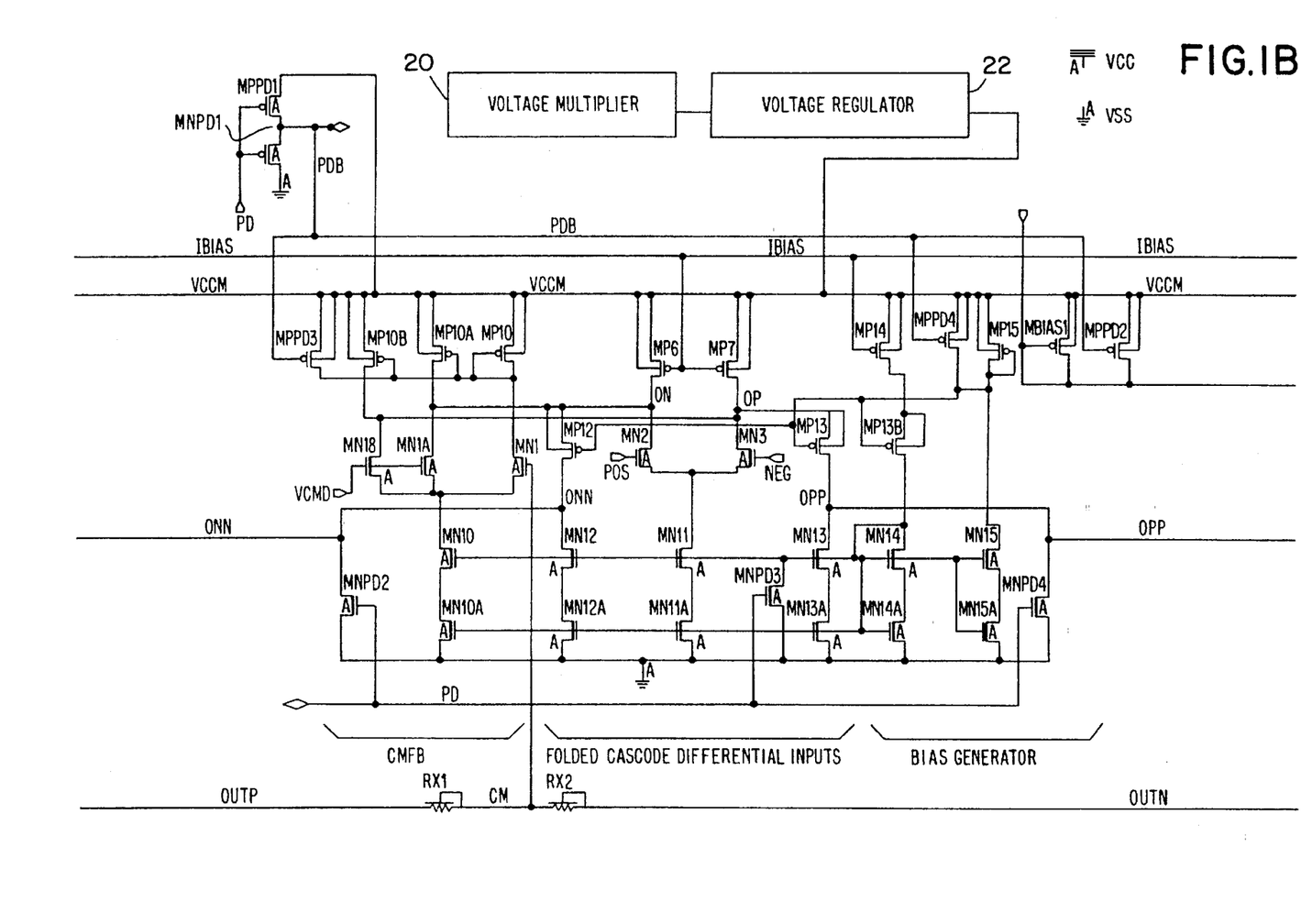
FIGS. 1B and 1C are circuit diagrams for the preferred embodiment of the fully differential CMOS power amplifier of the present invention, comprising FIGS. 1A and 1C, each showing one of the differential output stages, and FIG. 1B showing among other things the folded cascode differential input stage and the bias generator.
Figure 1C:
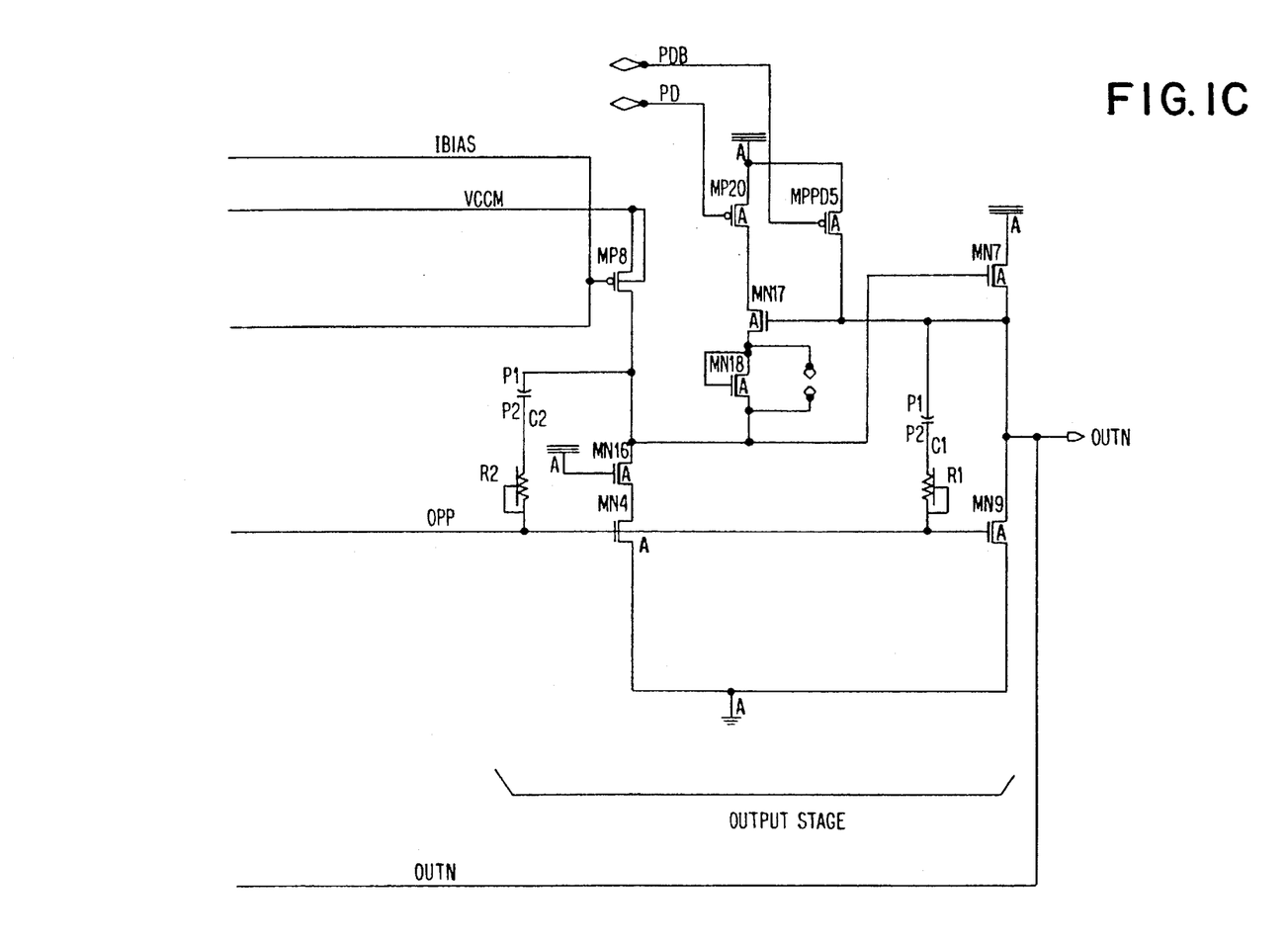

FIG. 1 is a circuit diagram for the preferred embodiment of the fully differential CMOS power amplifier of the present invention, using a folded cascode input stage and n-MOS transistors for the output drivers.

The preferred embodiment of the present invention is intended to be used as the output power amplifier on an integrated circuit analog signal recording and playback system such as disclosed in U.S. Pat. Nos. 4,890,259, 4,989,179, 5,220,531, 5,126,967, 5,241,494 and 5,164,915. Such integrated circuits already include a MOS charge pump voltage multiplier (the voltage multiplier 20 of FIG. 1) for other purposes, namely to provide the required high voltages for the erase and program functions for the on-chip floating gate storage cells from a single, relatively low voltage power supply to the chip, such a low voltage battery power supply providing VCC, and VSS, shown also as ground potential. MOS charge pump voltage multipliers are well known in the art, and need not be further described herein.

Also shown in FIG. 1 is a voltage regulator 22, used to regulate the multiplied voltage to reduce the voltage variation and noise coupled to the power amplifier from the charge pump, which typically has a ripple voltage on its output. The ripple period depends on the period of the pump clock generator. The ripple magnitude depends on the pumping capacitors, the magnitude of the pumping clock waveform (typically equal to VCC), the output loading current and the output loading capacitance. Even though this ripple is reduced by the power supply rejection capability of the power amplifier, it is still significant, so the voltage regulator 22 is used to reduce the ripple seen by the power amplifier. This is especially important in the idle state (when the input signal is zero), as the ripple will appear on the output as an idle noise which limits the signal to noise ratio of the power amplifier.

The fully differential output CMOS power amplifier includes a differential stage, a gain stage, common mode feedback and a bias generator, all of which get their power from the output of the voltage regulator, VCCM, a voltage significantly higher than VCC. The output stage, the only stage requiring substantial power, gets its power from the normal system power supply VCC.

The preferred embodiment of the present invention shown in FIG. 1 is intended to operate as part of an integrated circuit responsive to a power down signal to power down the circuit whenever the PD (power down) signal goes high. As the subsequent description will illustrate, the following notation is used in FIGS. 1 and 2 herein:

- p-channel devices are so indicated by the circle in the gate contact, and further by the P appearing as the second letter of the device designation
- n-channel devices are so indicated by the absence of a circle in the gate contact, and further by the N appearing as the second letter of the device designation
- native devices are indicated by the thickened line parallel to the gate and by the letter A adjacent thereto
- most devices associated with the power down function are so indicated by "PD" appearing as the third and fourth letter designations of the respective devices In the circuit of FIG. 1, n-channel device MNPD1 and p-channel device MPPD1 are used to invert the PD (power down) signal to provide the signal PDB (PD bar or $\overline{PD}$). Device MPPD1 is connected to VCCM instead of VCC so that PDB is VCCM when PD is zero. Thus when the circuit is enabled (PD=0v), PDB will be equal to VCCM, completely shutting off p-channel devices MPPD2/3/4/5A. At the same time, PD=0v (PD=VSS) will also completely shut off n-channel devices MNPD2/3/4. As shall subsequently be described in further detail, devices MPPD2/3/4/5A and MNPD2/3/4 will be turned on when PD goes high to cut off all current paths in the circuit.

Current IBIAS to the circuit is a controlled current source (actually a current sink, though the phrase current source may be used generically hereafter for source or sink, as will be obvious to one skilled in the art) mirrored from a bias current generator elsewhere in the integrated circuit, as is well known in the art. This sets the gate-source voltage of transistor MBIAS1, the input bias reference p-MOS device, to provide the basic current mirror for biases of other p-channel devices, namely devices MP6/7/8/8A/14, each therefore acting as a bias current source for various other parts of the circuit.

The bias current through p-channel device MP14 also flows through p-channel device MP13B and n-channel devices MN14, MN14A to provide biases for n-MOS current mirrors formed by n-channel devices MN11/MN11A, MN12/MN12A, MN13/MN13A of the folded cascode differential input stage, and also to provide biases for n-channel devices MN10/MN10A of the common mode feedback network. It also provides a bias for n-channel devices MN15/MN15A connected in series with diode connected p-channel device MP15 to generate a p-MOS bias for the gates of p-channel devices MP12, MP13 of the folded cascode differential input stage. p-channel device MP13B is used to force the drain-source voltage of p-channel device MP14 to be close to the drain-source voltage of p-channel devices MP7 and MP6 for more precise current matching between p-channel device MP7 and n-channel devices MN13/MN13A and between p-channel device MP6 and n-channel devices MN12/MN12A (since n-channel devices MN13/MN13A and MN12/MN12A are mirrored from n-channel device MN14, which is sinking the bias current from p-channel devices MP14).

The n-MOS cascode current mirror formed by n-channel devices MN14/MN14A uses a native (VT≈0v) n-MOS device MN14 in series with enhancement mode n-MOS device MN14A to minimize the headroom voltage, since the bias voltage is only one gate-source voltage of the enhancement mode n-MOS device MN14A (this is in comparison with the normal two diode connected n-MOS transistors in series, which requires the sum of 2 gate-source voltages of headroom voltage). n-channel device MN14A is in saturation, since its drain voltage is close to its gate voltage. n-channel device MN14 is also in saturation since its threshold voltage is a few hundred millivolts because of the body effect. Hence, the cascoding effect is achieved with lower headroom voltage by using a native device connected in series with an enhancement n-MOS device. The native n-MOS device has its drain and gate tied together. The other n-MOS device mirrors the current to n-channel devices M10/MN10A, MN11/MN11A, MN12/MN12A, MN13/MN13A, and MN15/MN15A, which use the same scheme.

n-channel devices MN15/MN15A mirror the current from n-channel devices MN14/MN14A to p-channel device MP15 to generate the bias for the common gate connection of p-channel devices MP12 and MP13. p-channel device MP15 is sized such that the source voltages of p-channel devices MP12 and MP13 sit close to VCCM (only one drain-source saturation voltage of p-channel devices MP6 and MP7 away from VCCM) for maximum swing on the nodes OP, ON and hence on nodes OPP, ONN to optimize the size of n-channel device MN9 and MN9A.

n-channel devices MN2/MN3, p-channel devices MP6/MP7 and MP12/MP13, and n-channel devices MN12/MN12A, MN11/MN11A and MN13/MN13A constitute a folded differential native n-MOS input stage. The native n-MOS devices MN2 and MN3 are chosen for the input n-MOS pair to increase the minimum input voltage range by one enhancement mode threshold voltage and thus lower the minimum voltage input close to ground. The outputs of the folded cascode input stage on nodes OPP and ONN are differential, and are each applied to a respective single ended n-MOS output stage. In particular, when the differential inputs POS and NEG are applied to the differential input n-channel pair MN2 and MN3, the differential outputs of nodes ON and OP respond in opposite directions, in turn causing nodes ONN and OPP to follow the voltage variations of nodes ON and OP, respectively, through the common gate connected p-MOS devices MP12 and MP13. The voltages on nodes ONN and OPP are thus applied differentially to the two identical n-MOS output stages.

n-channel devices MN4, MN16, p-channel device MP8, n-channel devices MN7, MN9, p-channel device MP20, n-channel devices MN17, MN18, p-channel device MPPD5, resistor R2, capacitor C2, resistor R1 and capacitor C1 constitute an n-MOS output stage. The second identical n-MOS output stage is formed by corresponding devices having the same designations followed by the letter "A", and accordingly the description to follow is also directly applicable, though being responsive to the opposite node ONN, the opposite voltage of the differential voltages on nodes ONN, OPP. In each output stage, the capacitor is realized on-chip in integrated circuit form using techniques well known in MOS integrated circuits and MOS integrated circuit formation.

p-channel device MPPD5 is part of the shutdown circuit, and is held off (PDB high) when the circuit is not powered down (PD low). p-channel device MP20 is also related to the power down function, and is held on by PD when the circuit is not powered down. n-channel device MN7 is used in a source follower mode, and is a native n-MOS to increase the high swing by one enhancement mode threshold voltage to make the high end output OUTN swing of the output stage close to the power supply voltage VCC. n-channel devices MN4, MN16, p-channel device MP8, resistor R2, and capacitor C2 provide gain/level shift for the source follower MN7, with resistor R2 and capacitor C2 providing a compensation network for the gain/level network. Resistor R1 and capacitor C1 provide a compensation network for the final gain output stage comprising n-channel device MN9.

The output stage described above operates as follows: Assuming the signal on node OPP goes lower, n-channel device MN9 is gradually turned off, and n-channel device MN4 is also gradually turned off. p-channel device MP8 pulls the gate of n-channel device MN7 toward VCCM, and device MN7 in turn pulls the output OUTN toward VCC. Conversely, as the voltage on node OPP goes higher, n-channel device MN9 is gradually turned on, pulling the output OUTN lower. n-channel device MN4 is also gradually turned on harder, pulling the gate of n-channel device MN7 toward ground, tending to turn off device MN7 to release OUTN from the pull up effects of device MN7. Thus the output stage acts as an inverting stage.

n-channel devices MN17 and MN18 are to reduce the crossover distortion. At the mid point (analog ground, e.g. 1.5 V, or zero differential input to the system), as the voltage on node OPP goes from low to high, n-channel device MN4 is turned on, pulling the gate of n-channel device MN7 too quickly toward ground, shutting n-channel device MN7 off completely. In the meantime, n-channel device MN9 is not yet turned on, so the output OUTN is floating for a short period until n-channel device MN9 is turned on. This causes distortion. To prevent this, the voltage on the gate of n-channel device MN7 is lowered slowly to turn off device MN7 slowly by a local feedback path from the output OUTN to the gate of n-channel device MN17, which does not allow the gate of n-channel device MN7 to fall too rapidly. n-channel device MN16 acts as a resistive path to further slow down the falling of the gate of n-channel device MN7. By not allowing the gate of device MN7 to fall before device MN9 is turned on, a direct current path is created between VCC and VSS through devices MN7 and MN9 for a short period. This is the familiar tradeoff between reducing crossover distortion and increasing the direct current consumption. In that regard, n-channel device MN18, as an option, may be shorted for reducing further the crossover distortion at the expense of increasing the direct current consumption.

The idle current in the output stage (when there is no differential signal) is precisely set by the size ratio of n-channel devices MN9 to MN4 (and the bias current in n-channel device MN4, which is set by the current mirrored to p-channel device MP8). Note that the gate voltages of n-channel devices MN9 and MN4 are the same and the drain voltage of n-channel device MN9 is almost the same as the drain voltage of n-channel device MN4 by the action of source follower native n-MOS device MN7. Also because the gate of the n-channel device is allowed to swing higher than the normal power supply voltage VCC, allowing the use of a much smaller device for n-channel device MN9 (better matching between devices MN9 and MN4 because they are closer together physically), this allows the idle current to be controlled much better.

As stated before, n-channel devices MN4A, MN16A, p-channel device MP8A, n-channel device MN7A, MN9A, p-channel device MP20A, n-channel devices MN17A, MN18A, p-channel device MPPD5A, resistor R2A, capacitor C2A, resistor R1A and capacitor C1A constitute another exact replica of the above n-MOS output stage. This output branch receives its input from the ONN signal, which is differentially is always in the opposite direction to the OPP signal by the action of the input stage. Thus the output OUTP always swings in the opposite direction of the output OUTN.

The outputs OUTP and OUTN are normally connected across a speaker for driving differentially to increase the power output by four times (since the voltage swing across the speaker is doubled) as compared to a single ended power amplifier. Normally the power amplifier is used in a unity gain mode, in which case OUTP of the respective output stage is also connected to NEG input of the differential input stage.

Resistors RX1 and RX2 are common mode feedback resistors connected between the differential outputs. Their resistances are high to prevent excessive loading. The resistor network is used to sense the common mode voltage on the inputs of the power amplifier and to feed back the common mode voltage to a common mode feedback amplifier for common mode voltage correction.

n-channel devices MN1/MN1A/MN1B, p-channel devices MP10/MP10A/MP10B and n-channel devices MN10/MN10A constitute the common mode feedback amplifier. It is a conventional MOS differential amplifier with the native n-MOS transistors as the input n-MOS pair. The native n-MOS is used to increase the input voltage range as in the folded cascode input pair. The common mode input VCMD is the analog ground level (the mid point, e.g. 1.5 V in the preferred embodiment). Assuming the average of the differential outputs OUTN and OUTP is somehow higher than normal, the voltage of node CM at the resistive network junction will be higher than VCMD, causing n-channel device MN1 to turn on harder, pulling the gate of p-channel device MP10 lower, which turns p-channel devices MP10A and MP10B on harder and pulls the node OP and ON higher respectively, in turn pulling both nodes ONN and OPP higher by the common gate connected p-channel devices MP12, MP13. With the voltages of nodes ONN and OPP higher, the voltages of both nodes OUTN and OUTP go lower (the output stages of the amplifier are inverting stages), restoring the common mode voltage in the output nodes OUTN and OUTP. As the differential output OUTN and OUTP swing in the opposite direction, opposite action happens.

The folded differential input stage obtains its power from the regulated pumped output VCCM, which allows nodes ON and OP to be biased one saturation drain-source voltage $VDS_{sat}$ from VCCM (VCCM$-VDS_{MP6/7sat}$). This also means the voltages of nodes OPP and ONN can swing to two saturation VDSs from VCCM (VCCM$-VDS_{Mp6/7sat}-VDS_{Mp12/13sat}$), which allows the size of n-channel devices MN9/MN9A to be small devices, even though n-channel devices MN9/MN9A have to sink a relatively huge current from the low impedance load. The level shift/gain stages (n-channel devices MN4, MN16, p-channel device MP8, resistor R2 and capacitor C2, and n-channel devices MN4A, MN16A, p-channel device MP8A, resistor R2A and capacitor C2A) get their power supply from VCCM, which allows the gate of n-channel devices MN7/MN7A to swing close to VCCM. This allows n-channel devices MN7/MN7A to be also to be small, even though n-channel devices MN7/MN7A have to source a relatively huge current to the low impedance load. The common mode feedback circuit and the bias generator also get their power supply from VCCM for proper operation.

As stated before, when the circuit is enabled (PD=0v), PDB will be equal to VCCM, completely shutting off p-channel devices MPPD2/3/4/5/5A. At the same time, PD=0v (PD=VSS) will also completely shut off n-channel devices MNPD2/3/4. However when PD goes high for power down, n-channel devices MNPD2/3/4 PDB will be turned on, and PDB will go low, turning on p-channel devices MPPD2/3/4/5/5A. This shuts down the various bias current sources in the amplifier and cuts off all current paths in the circuit. The turning on of p-channel devices MPPD5/5A on power down clamps the voltage of output nodes OUTN and OUTP at VCC, thereby holding the differential output at zero. Also on power down, p-channel devices MP20/20A are turned off to cut off the current path from VCC to VCCM through n-channel devices MN17/17A, MN18/18A and p-channel devices MP8/8A.

Figure 2:
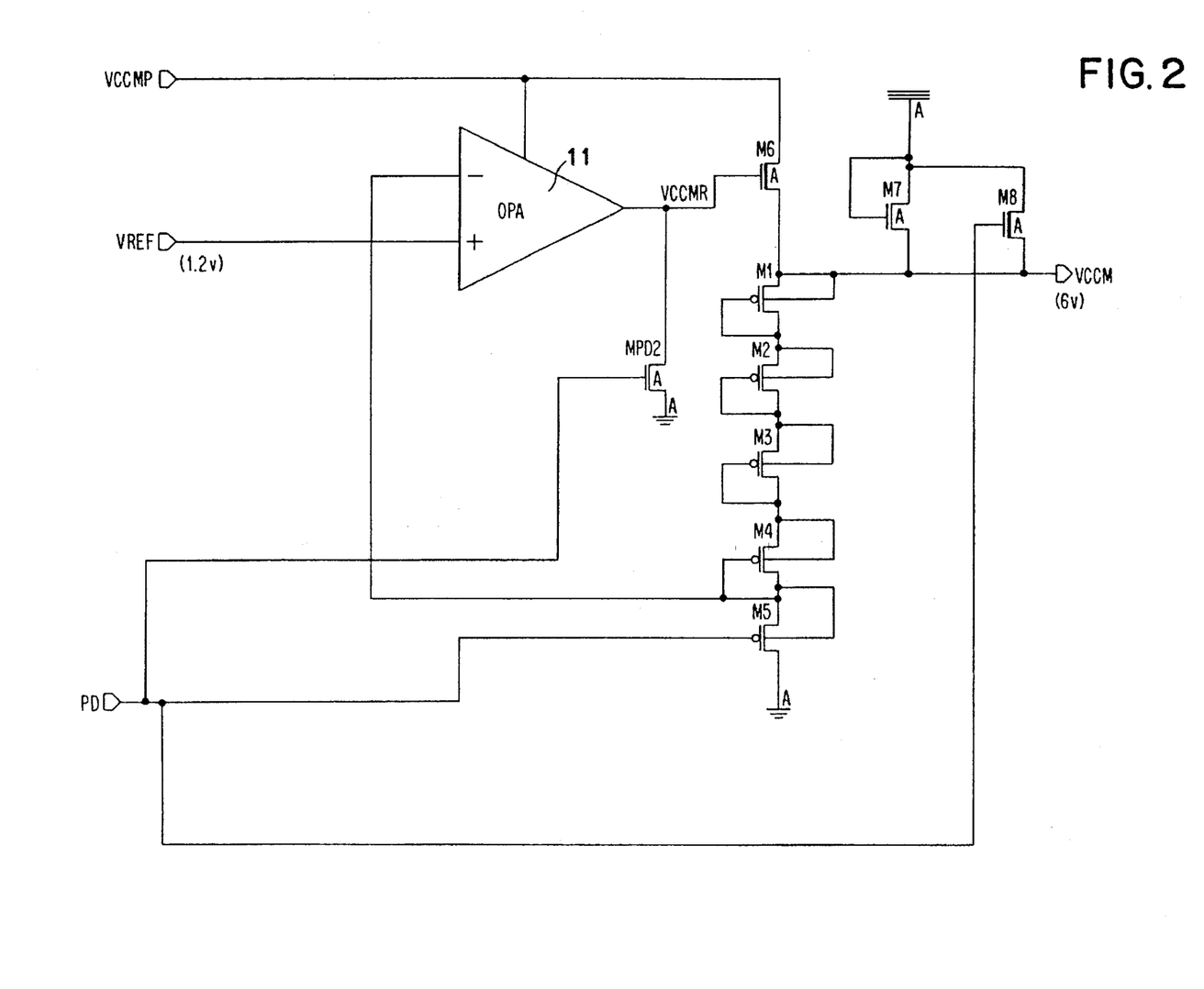
FIG. 2 is a circuit diagram for the voltage regulator used in the circuit of FIG. 1.

FIG. 2 is a circuit diagram for the voltage regulator 22 used in the circuit of FIG. 1. As shown in FIG. 2, an operational amplifier I1 is configured in a negative feedback loop to regulate the multiplied voltage VCCMP to a fixed level VCCM based on an input reference voltage VREF to reduce the coupling of power supply variations and noise to the power amplifier. The operational amplifier I1 used in the preferred embodiment is a conventional two stage operational amplifier. p-channel devices M1/M2/M3/M4/M5, when p-channel device M5 is on, are a series of diode connected devices, and each have their sources connected to their own well to eliminate body effect) to simulate a resistor divider of larger value resistors to reduce current loading to the voltage multiplier. In this way, p-channel devices M1/M2/M3/M4/M5 are small as compared to the large area that would be needed to realize large value resistors on-chip. In this Figure, n-channel devices MPD2 and M8 are used for power down purposes. In normal operation (PD low), n-channel device MPD2 and M8 will be off. This will hold P-channel device M5 on, activating the simulated resistor divider to feed back one fifth of the regulated voltage VCCM to the negative input of the operational amplifier. On power down when PD goes high, n-channel devices MPD2 and M8 will be turned on. n-channel devices M7/M8 are used to keep VCCM close to VCC during power down. This holds the negative input to the operational amplifier I1 high, and N-channel device MPD2 being on pull the voltage on node VCCMR to ground, turning off N-channel device M6 to decouple the output VCCM and the resistor divider from the voltage multiplier.

Thus the regulator output VCCM is regulated precisely by the negative feedback action of the operational amplifier at 5 times the reference voltage VREF, which is also 5 times the gate-source voltage of each of the p-channel devices M1/M2/M3/M4/M5 for the current flowing there through at the regulated voltage. As can be seen from the FIG., n-channel devices M6, M8 are native n-MOS devices. n-channel device M8 is to precharge the output node VCCM close to VCC, and n-channel device M7 is to keep VCCM within one threshold voltage of VCC on startup until the charge pump output VCCMP is high enough.

There has been described herein a fully differential output CMOS power amplifier that uses small output transistors for driving a low impedance load such as an 8 ohm speaker at low power supply voltages such as 2.5 volts by utilizing a stepped up voltage for a folded cascode differential input with native n-MOS devices, for the level shift/gain stage, for the common feedback network, and for the bias generator. The fully differential output CMOS power amplifier has a folded cascode differential input stage that uses native n-MOS for near rail-to-rail common mode input range, an output stage that uses native n-MOS devices in a source follower configuration for high swing efficiency, and a local feedback mechanism for reducing crossover distortion for the n-MOS output stage. A voltage regulator is provided for the stepped up voltage that uses very little current without requiring large value resistors by utilizing diode connected p-MOS transistors as a resistor divider. The n-MOS device output stage includes circuitry that accurately sets the idle current by utilizing a source follower native n-MOS to force the drain voltage of the output driver n-MOS to be almost the same as the drain voltage of a reference n-MOS device. However while a preferred embodiment of the present invention have been disclosed and described herein, it will be obvious to those skilled in the art that various changes in form and detail may be made therein without departing from the spirit and scope of the invention.

What is claimed is:

1. A differential output CMOS power amplifier for low voltage operation comprising:

a folded cascode differential input stage having native n-MOS devices forming the differential input;

a level shift and gain stage coupled to the differential input stage;

a pair of power output stages coupled to the level shift and gain stage, each power output stage having an output terminal forming one of the differential outputs of the CMOS power amplifier;

a bias generator for providing bias currents to the folded cascode differential input stage, the level shift and gain stage, and the pair of power output stages;

the pair of power output stages having input power terminals for coupling to a low voltage power supply;

the bias generator, the folded cascode differential input stage and the level shift and gain stage having terminals for coupling to a voltage substantially higher than the low voltage power supply.

2. The differential output CMOS power amplifier of claim 1 wherein the pair of power output stages each have a n-MOS device connected as a source follower.

3. The differential output CMOS power amplifier of claim 2 wherein the pair of power output stages each have local feedback for reducing crossover distortion.

4. The differential output CMOS power amplifier of claim 1 wherein the pair of power output stages each have as an output driver a native n-MOS device connected as a source follower to provide a high output voltage swing efficiency.

5. The differential output CMOS power amplifier of claim 4 wherein the pair of power output stages each have a reference source follower native n-MOS device coupled to set the idle current for the output stage by forcing the drain voltage of the output driver to approximately equal the drain voltage of the reference source follower native n-MOS device.

6. The differential output CMOS power amplifier of claim 1 further comprised of a common mode voltage feedback circuit coupled to the output terminals for feeding the common mode output voltage back to the differential input stage.

7. The differential output CMOS power amplifier of claim 6 wherein the common mode voltage feedback circuit is for coupling to a voltage substantially higher than the low voltage power supply.

8. The differential output CMOS power amplifier of any one of claims 1, 6 or 7 further comprised of a voltage multiplier for coupling to a low voltage power supply and for providing the voltage substantially higher than the low voltage power supply.

9. The differential output CMOS power amplifier of claim 8 further comprised of a voltage regulator coupled to the voltage multiplier to regulate the voltage substantially higher than the low voltage power supply irrespective of variations in the output voltage of the voltage multiplier.

10. The differential output CMOS power amplifier of claim 9 wherein the voltage regulator comprises:
- a plurality of diode connected p-MOS devices connected in series;
- a first power supply connection connected to one end of the series connected p-MOS devices;
- a regulator output connection connected to the second end of the series connected p-MOS devices;
- a second power supply connection;
- a transistor coupled between the second power supply connection and the output connection; and,
- an amplifier coupled to the transistor for controlling the current flow from the second power supply connection through the transistor responsive to the difference between the voltage across one on the series connected p-MOS devices and a reference voltage.

11. A differential output CMOS power amplifier comprising:
- a folded cascode differential input stage with native n-MOS devices forming the differential input; and,
- a pair of power output stages coupled to the folded cascode differential input stage, each power output stage having an output terminal forming one of the differential outputs of the CMOS power amplifier, the output stages each having a native n-MOS device connected as a source follower to provide a high output voltage swing efficiency.

12. The differential output CMOS power amplifier of claim 11 wherein the pair of power output stages are for coupling to a low voltage power supply, and the differential input stage is for coupling to a voltage substantially higher than the low voltage power supply.

13. A differential output CMOS power amplifier comprising:
- a folded cascode differential input stage having native n-MOS devices as the input devices for near rail-to-rail common mode input range;
- a level shift and gain stage coupled to the differential input stage; and,
- a pair of power output stages coupled to the differential input stage, each power output stage having an output terminal forming one of the differential outputs of the CMOS power amplifier.

14. The differential output CMOS power amplifier of claim 13 wherein the pair of power output stages each have a native n-MOS device connected as a source follower.

15. The differential output CMOS power amplifier of either claim 13 or claim 14 wherein the pair of power output stages are for coupling to a low voltage power supply, and the differential input stage is for coupling to a voltage substantially higher than the low voltage power supply.

* * * * *

UNITED STATES PATENT AND TRADEMARK OFFICE
CERTIFICATE OF CORRECTION

PATENT NO.   : 5,631,606
DATED        : May 20, 1997
INVENTOR(S)  : Tran

It is certified that error appears in the above-identified patent and that said Letters Patent is hereby corrected as shown below:

<u>Title page,</u>
Item [56], References Cited, U.S. PATENT DOCUMENTS, insert:

| | | | |
|---|---|---|---|
| -- 4,794,278 | 12/1988 | Vajdic | 330/297 |
| 4,825,142 | 4/1989 | Wang | 323/314 |
| 4,847,519 | 7/1989 | Wahl et al. | 307/296.2 |
| 4,871,979 | 10/1989 | Shearer et al. | 330/253 |
| 4,918,398 | 4/1990 | Huijsing et al. | 330/252 |
| 4,956,569 | 9/1990 | Olivo et al. | 307/443 |
| 5,029,282 | 7/1991 | Ito | 307/296.8 |
| 5,041,739 | 8/1991 | Goto | 307/296.2 |
| 5,066,871 | 11/1991 | Wilcox | 307/296.1 |
| 5,075,572 | 12/1991 | Poteet et al. | 307/350 |
| 5,140,281 | 8/1992 | Fujisawa et al. | 330/261 |
| 5,177,450 | 1/1993 | Lee et al. | 330/253 |
| 5,179,296 | 1/1993 | Ito | 307/296.2 |
| 5,180,928 | 1/1993 | Choi | 307/296.6 |
| 5,202,587 | 4/1993 | McLaury | 307/296.2 |
| 5,212,455 | 5/1993 | Pernici et al. | 330/253 |
| 5,212,456 | 5/1993 | Kovalcik et al. | 330/261 |
| 5,227,675 | 7/1993 | Taguchi | 307/296.1 |
| 5,268,871 | 12/1993 | Dhong et al. | 365/226 |
| 5,281,924 | 1/1994 | Maloberti et al. | 330/253 |
| 5,289,137 | 2/1994 | Nodar et al. | 330/296 |
| 5,306,954 | 4/1994 | Chan et al. | 307/110 |
| 5,315,264 | 5/1994 | Sundby et al. | 330/253 |

UNITED STATES PATENT AND TRADEMARK OFFICE
CERTIFICATE OF CORRECTION

PATENT NO.   : 5,631,606
DATED        : May 20, 1997
INVENTOR(S)  : Tran It is certified that error appears in the above-identified patent and that said Letters Patent is hereby corrected as shown below:

| | | | |
|---|---|---|---|
| 5,334,948 | 8/1994  | Fong et al.    | 330/253 |
| 5,335,200 | 8/1994  | Coffman et al. | 365/218 |
| 5,347,172 | 9/1994  | Cordoba et al. | 307/296.2 |
| 5,367,489 | 11/1994 | Park et al.    | 365/189.11 |
| 5,374,859 | 12/1994 | Doyle et al.   | 327/65 |
| 5,394,026 | 2/1995  | Yu et al.      | 327/536 |
| 5,394,027 | 2/1995  | Park           | 327/536 -- |

Signed and Sealed this

Fourteenth Day of January, 2003

JAMES E. ROGAN
*Director of the United States Patent and Trademark Office*